United States Patent
Jiang et al.

(10) Patent No.: US 12,416,741 B2
(45) Date of Patent: Sep. 16, 2025

(54) INTEGRATED RESERVOIR CHARACTERIZATION USING NMR T1-T2 MEASUREMENTS

(71) Applicant: ConocoPhillips Company, Houston, TX (US)

(72) Inventors: Tianmin Jiang, Houston, TX (US); Ronald J. M. Bonnie, Houston, TX (US)

(73) Assignee: ConocoPhillips Company, Houston, TX (US)

( * ) Notice: Subject to any disclaimer, the term of this patent is extended or adjusted under 35 U.S.C. 154(b) by 38 days.

(21) Appl. No.: 18/232,461

(22) Filed: Aug. 10, 2023

(65) Prior Publication Data

US 2024/0053503 A1 Feb. 15, 2024

Related U.S. Application Data

(60) Provisional application No. 63/396,844, filed on Aug. 10, 2022.

(51) Int. Cl.
| | |
|---|---|
| *G01V 3/32* | (2006.01) |
| *G01N 24/08* | (2006.01) |
| *G01R 33/50* | (2006.01) |
| *G01V 3/38* | (2006.01) |

(52) U.S. Cl.
CPC ............. *G01V 3/32* (2013.01); *G01N 24/081* (2013.01); *G01R 33/50* (2013.01); *G01V 3/38* (2013.01)

(58) Field of Classification Search
CPC . G01V 3/32; G01V 3/38; G01R 33/50; G01N 24/081
See application file for complete search history.

(56) References Cited

U.S. PATENT DOCUMENTS

| | | | |
|---|---|---|---|
| 10,900,915 B2* | 1/2021 | Gawankar | G01R 33/448 |
| 2018/0003786 A1 | 1/2018 | Washburn | |
| 2019/0025453 A1* | 1/2019 | Chen | G01V 3/32 |
| 2019/0277135 A1 | 9/2019 | Zha | |
| 2020/0264331 A1 | 8/2020 | Venkataramanan et al. | |
| 2021/0063600 A1 | 3/2021 | Li et al. | |
| 2021/0127028 A1* | 4/2021 | Ishihara | H04N 1/00917 |
| 2022/0003695 A1 | 1/2022 | Elsayed et al. | |

OTHER PUBLICATIONS

International Search Report and the Written Opinion of the International Searching Authority for International Application No. PCT/US2023/029930 dated Oct. 18, 2023 (4 pages).

* cited by examiner

*Primary Examiner* — Gregory H Curran
(74) *Attorney, Agent, or Firm* — Polsinelli PC

(57) ABSTRACT

Implementations described and claimed herein provide systems and methods for developing resources from a reservoir. In one implementation, obtaining nuclear magnetic resonance (NMR) log data is obtained for one or more wells of the reservoir. The NMR data is captured using one or more logging tools. An interpreted NMR log is generated by quantifying one or more fluid producibility parameters. The one or more fluid producibility parameters are quantified by processing the NMR log data using automated unsupervised machine learning. A production characterization of the reservoir is generated based on the interpreted NMR log, with the reservoir being developed based on the production characterization.

20 Claims, 13 Drawing Sheets

INTEGRATED RESERVOIR CHARACTERIZATION USING NMR T1-T2 MEASUREMENTS

CROSS-REFERENCE TO RELATED APPLICATIONS

The present application claims priority to U.S. Provisional Patent Application Ser. No. 63/396,844 filed on Aug. 10, 2022, which is incorporated by reference in its entirety herein.

FIELD

Aspects of the present disclosure relate generally to systems and methods for developing resources from unconventional reservoirs and more particularly to unconventional resource development using an integrated machine learning framework with unsupervised learning on nuclear magnetic resonance ("NMR") measurements.

BACKGROUND

Unconventional reservoirs, such as shale gas reservoirs, shale oil reservoirs, and/or the like, are generally complex both in terms of geology and development. More particularly, shales are highly heterogeneous due to nanoscale pore size and highly variable structures. Characterizing shale geology in terms of permeability and natural fractures remains a pervasive challenge. Exacerbating these challenges, performance of an unconventional well is strongly driven by development approaches in drilling, well placement, and completion, and the technology to reliably characterize and model hydraulic fractures is insufficient. The insufficiencies of such conventional technologies are especially apparent given the inability to distinguish or quantify producible oil. For example, dynamic results from production often show a significantly different water cut than anticipated based on total water saturation estimates from traditional static formation evaluation models. It is with these observations in mind, among others, that various aspects of the present disclosure were conceived and developed.

SUMMARY

Implementations described and claimed herein address the foregoing problems by providing systems and methods for developing resources from a reservoir. In one implementation, obtaining nuclear magnetic resonance (NMR) log data is obtained for one or more wells of the reservoir. The NMR data is captured using one or more logging tools. An interpreted NMR log is generated by quantifying one or more fluid producibility parameters. The one or more fluid producibility parameters are quantified by processing the NMR log data using automated unsupervised machine learning. A production characterization of the reservoir is generated based on the interpreted NMR log, with the reservoir being developed based on the production characterization.

Other implementations are also described and recited herein. Further, while multiple implementations are disclosed, still other implementations of the presently disclosed technology will become apparent to those skilled in the art from the following detailed description, which shows and describes illustrative implementations of the presently disclosed technology. As will be realized, the presently disclosed technology is capable of modifications in various aspects, all without departing from the spirit and scope of the presently disclosed technology. Accordingly, the drawings and detailed description are to be regarded as illustrative in nature and not limiting.

DETAILED DESCRIPTION

Aspects of the present disclosure involve systems and methods for developing resources from a reservoir, such as an unconventional reservoir. Generally, the presently disclosed technology generates a production characterization for the reservoir. In some aspects, the production characterization is generated based on an interpreted nuclear magnetic resonance (NMR) log. More particularly, the interpreted NMR log is generated using automated unsupervised machine learning by quantifying or otherwise characterizing one or more fluid producibility parameters from NMR log data, such as spin-lattice relaxation time (T1) and/or the spin-spin relaxation time (T2) log data. The fluid producibility parameters may include, for example, fluid-filled porosity and saturation, producible oil volumes, matrix pore size, formation wettability, and/or the like.

Static formation evaluation models based on logs such as density, neutron, resistivity and gamma ray may be used to understand lithology, total porosity, and water saturation. However, such static models are generally insufficient to distinguish or quantify producible oil. Further, dynamic results from production often provide a significantly different water cut than anticipated based on total water saturation estimates from such static models. Conversely, the production characterization generated based on the interpreted NMR log provides, for example, a characterization of saturation and producibility of hydrocarbons aligned with dynamic production data and validated by core analysis. The presently disclosed technology thus distinguishes fluid typing intuitive and interactive testing, validation and understanding of saturation and producibility of hydrocarbons and water in reservoirs, such as unconventional reservoirs, which provides valuable insight and confidence for development. For example, the production characterization may include an identification of a landing point in horizontal wells in the reservoir. Other advantages will be apparent from the present disclosure.

Figure 1:
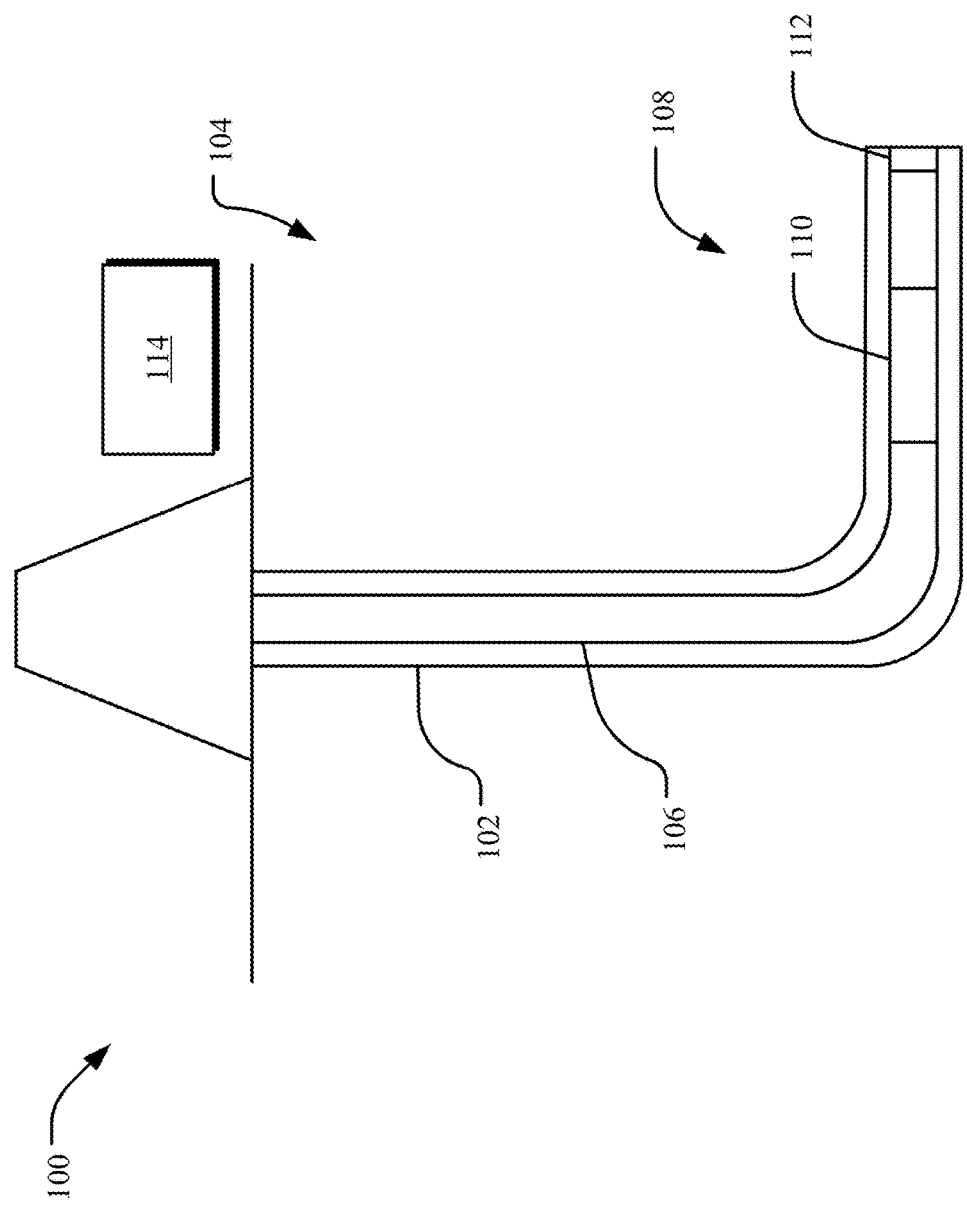
FIG. 1 illustrates an example environment for resource development from a reservoir.
Figure 2:
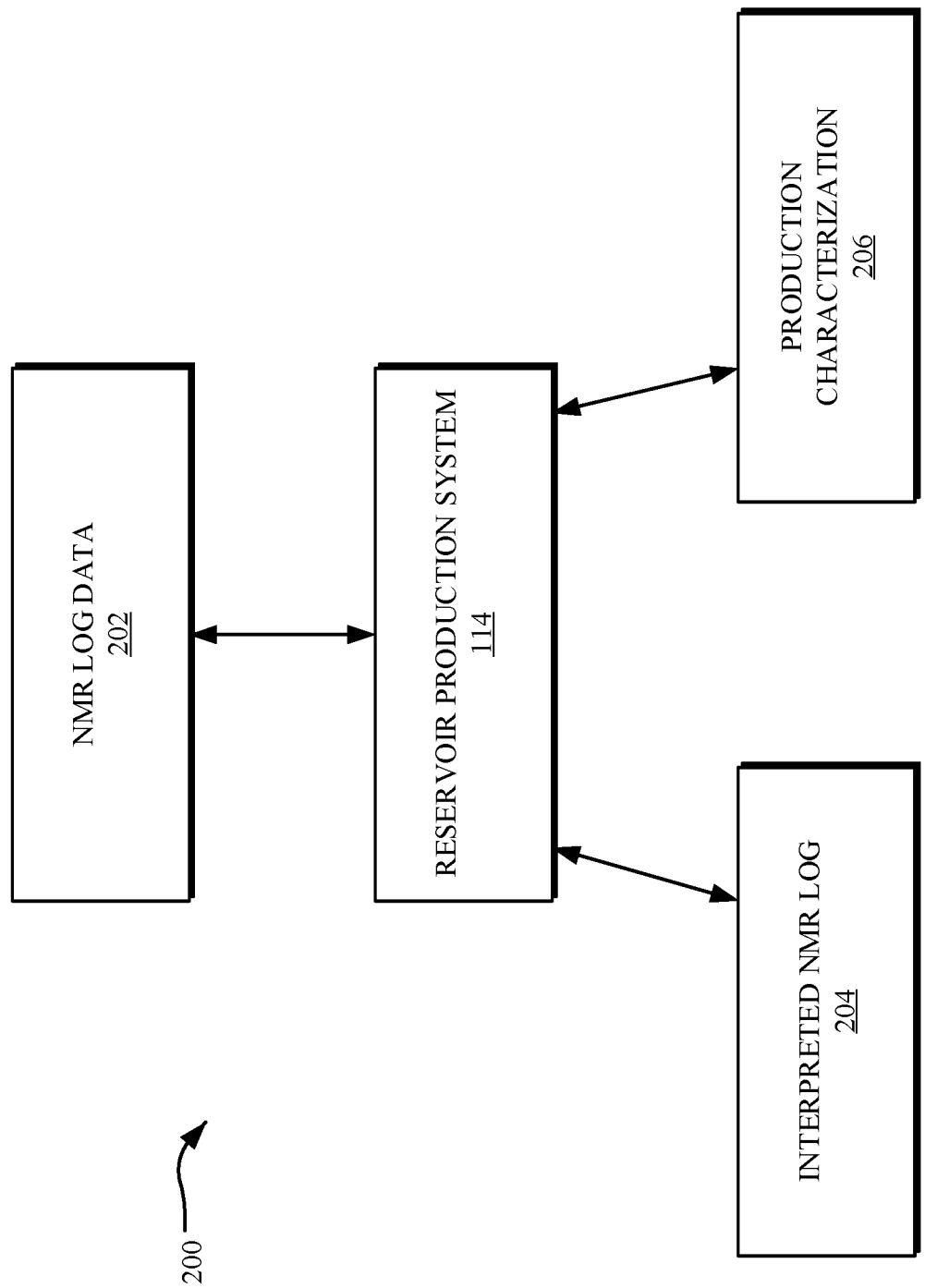
FIG. 2 shows an example reservoir production system environment.

To begin a detailed discussion of developing resources from a reservoir, reference is made to FIGS. 1-2. FIG. 1 illustrates an example environment 100 for resource development, and FIG. 2 shows an example reservoir production system environment 200. In one implementation, one or more wellbores 102 are formed in a subterranean formation 104 of a reservoir, such as an unconventional reservoir, an oil shale reservoir, and/or the like.

The wellbore 102 may involve a production tube. In some instances, the production tube may be deployed in a casing with cement filling an annulus formed between the casing and the subterranean formation 104, thus securing the casing within the wellbore 102. The production tube may be used in connection with the extraction of hydrocarbons from the subterranean formation 104 in the reservoir. While FIG. 1 illustrates the wellbore 102 having a substantially vertical portion and a substantially horizontal portion, it will be appreciated that the wellbore 102 may be any wellbore arrangement having any number of vertical portions, lateral portions, horizontal portions, and/or any angle therebetween. Further, while FIG. 1 illustrates a land-based operation, it will be appreciated that the wellbore 102 may correspond to land-based and/or sea-based operations.

In one implementation, a drill string 106 may extend into the wellbore 102 and include a bottom hole assembly 108. The bottom hole assembly 108 may include a variety of downhole tools, such as a drill bit 112, one or more NMR logging tools 110, and/or other steering tools, drilling tools, logging tools, measurement tools, and/or the like. The NMR logging tool 110 may be used to obtain data regarding fluids within a porous medium in the subterranean formation 104. For example, the NMR logging tool 110 may obtain data for use in determining wettability of fluids in reservoir rocks without interfering with fluid distribution within the rock.

In one example, the NMR measurement tool 110 provides NMR spectroscopy that may be used to understand fluids containing water and hydrocarbon phases within a porous medium. More particularly, when an assembly of magnetic moments are exposed to a magnetic field, bulk magnetization results with the magnetic moments aligning along the direction of the magnetic field. NMR spectroscopy may be used to measure the spin-lattice relaxation time (T1) and/or the spin-spin relaxation time (T2) of the fluid. The rate at which equilibrium is established in the bulk magnetization may be characterized by the NMR T1 measurement, and the NMR T2 measurement is an expression of the relaxation due to non-homogeneities in the local magnetic field over a sensing volume.

The NMR logging tool 110 may capture NMR log data 202, such as two-dimensional (2D) NMR T1-T2 log data, for the one or more wellbores 102. In one implementation, the NMR log data 202 is obtained by a reservoir production system 114, which applies unsupervised machine learning to generate an interpreted NMR log 204, such as a 2D interpreted NMR log. The interpreted NMR log 204 quantifies and otherwise characterizes one or more fluid producibility parameters, which generally differentiate between producible and non-producible hydrocarbons and water as a function of wettability or interfacial tension changes. The fluid producibility parameters may include, without limitation, fluid porosity and saturation, producible oil volumes, matrix pore sizes, and/or formation wettability. Using the interpreted NMR log 204, the reservoir production system 114 generates a production characterization 206 of the subterranean formation 104 of the reservoir.

As such, the reservoir production system 114 implements automated unsupervised learning on the NMR log data 202 to generate the interpreted NMR log 204 quantifying and otherwise characterizing one or more fluid producibility parameters. Core porosity and saturation measures, scanning electron microscope (SEM) images, rock evaluation pyrolysis, wettability measurements, and mercury injection capillary pressure (MICP) tests, among other dynamic production results, may be used to calibrate and/or validate the reservoir production system 114. The reservoir production system 114 thus provides an understanding of fluid types and volumetrics with the production characterization 206, which may be used to evaluate reservoir quality and estimate hydrocarbon production in connection with development. The interpreted NMR log 204 provides unique signatures of formation fluids, such as immovable hydrocarbon, producible oil, immovable water, and free water. The interpreted NMR log 204 further provides fluid and matrix properties, including but not limited to, fluid viscosity, pore geometry, and/or fluid-pore interaction. More particularly, due to the downhole environment of the wellbore 102, resolution limitations of the NMR logging tool 110, and/or the like, signatures of the various fluids in the subterranean formation 104 may not be separated and visually separating the signal contributions of different formation fluids on fluid typing maps, such as T1-T2 maps, is challenging. As such, the reservoir production system 114 applies automated unsupervised machine learning to separate the different fluid signatures, such as the T1-T2 signatures of pore fluids, in the interpreted NMR log 204. In doing so, the interpreted NMR log 204 provides fluid typing and fluid porosities and saturations for the subterranean formation 104. The reservoir production system 114 uses the fluid signatures to characterize fluid mobility, pore sizes, formation wettability, and/or the like. As such, the reservoir production system 114 provides an improved understanding of the subterranean formation 104 with the generation of the production characterization 206, which may include a characterization of saturation and producibility of hydrocarbon and water that static models are unable to distinguish. Further, integration of NMR, MICP, and SEM may provide pore body and throat size distribution with body to throat ratio (BTR), thereby providing an improved understanding of formation wettability. The reservoir production system 114 thus builds more precise models of fluid porosity and saturation, including oil, water, bound, and producible. The reservoir production system 114 provides such understanding in a timely and efficient manner within a few days relative to a few months of traditional techniques, thereby permitting optimized resource development without delay. For example, using the presently disclosed technology, pilot well data may be analyzed to determine whether to continue with or suspend drilling and completion of the wellbore 102, which may result in significant cost savings.

Figure 3:
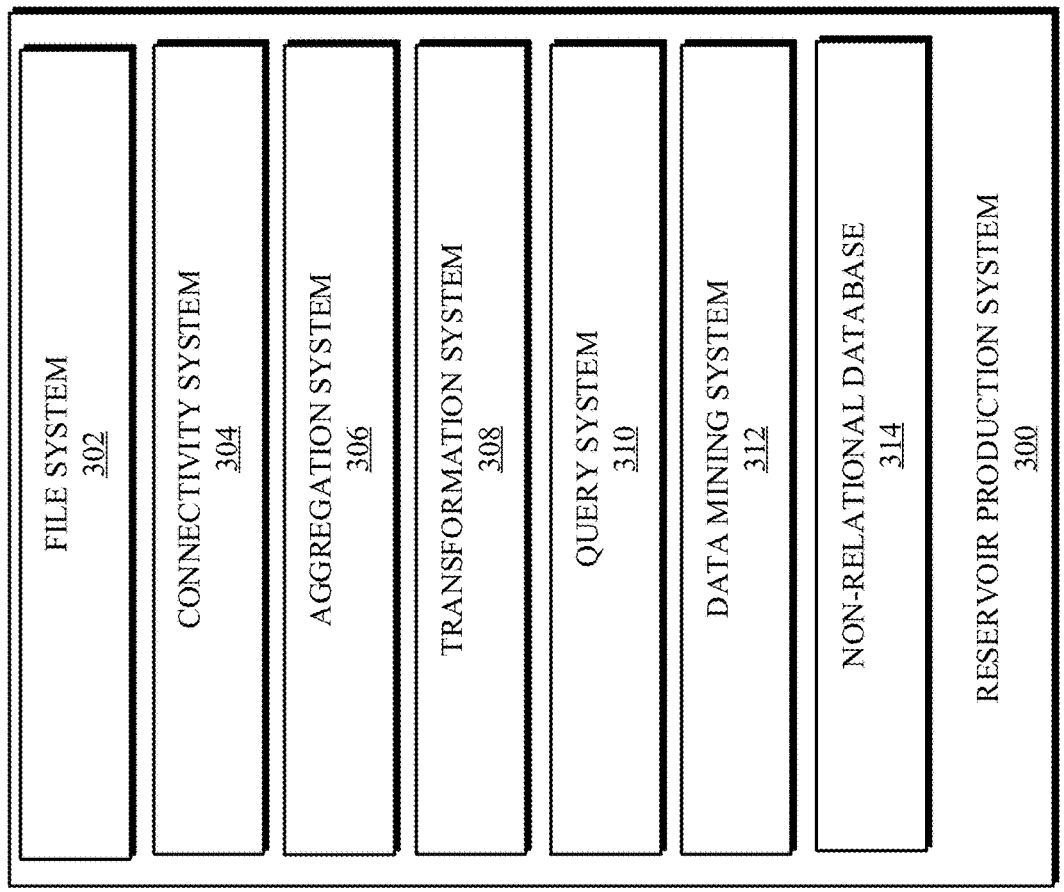
FIG. 3 illustrates example systems of the reservoir production system.

Turning to FIG. 3, an example resource production system 300 is shown that may be applicable to the resource production system 114. In one implementation, the resource production system 300 includes a cluster system that generates the performance characterization 206 using the interpreted NMR log 204 for developing resources from the reservoir based on the NMR log data 202. The NMR log data 202 may be raw data including heterogeneous structured and unstructured data captured from disparate sources associated with the subterranean reservoir 104. Some of the raw reservoir data may be captured directly, for example using one or more sensors deployed at the subterranean formation 104, such as the NMR log data 202 captured using the NMR logging tool 110. Such directly captured raw reservoir data may further include other core, well log, fluid sampling, production data, and/or the like. On the other hand, some of the raw reservoir data, such as drilling and completion parameters, may be obtained from public sources in accordance with regulatory requirements. Additionally, the raw reservoir data may include data input or otherwise obtained via an interface, at the direction of one or more computing units, and/or the like.

The raw reservoir data is obtained at the reservoir production system 300, which may be a distributed storage system, generally providing the efficiency and scalability to handle large volumes of heterogeneous data and the machine learning techniques to generate the interpreted NMR log 204 and/or the production characterization 206.

The raw reservoir data provided to the reservoir production system 300 may be stored in one or more non-relational databases 314. The data elements in the raw reservoir data may be tagged with one or more relevancy values, which represent information contained in a data element. In one implementation, the relevancy values are assigned a priority. The relevancy values and the priorities may be assigned as the raw reservoir data is provided or stored in the non-relational database 314.

In one implementation, the reservoir production system 300 is configured to parse, tag, and/or associate data elements for storage and analysis. In one implementation, the reservoir production system 300 includes a file system 302, a connectivity system 304, an aggregation system 306, a transformation system 308, a query system 310, and a data mining system 312 connected via a bus. However, additional or fewer systems or components are contemplated. Moreover, while each of the various modules and components are depicted in FIG. 3 as individual systems, infrastructures, components and/or applications, it is contemplated that all of such individual systems, infrastructures, components and/or applications may be combined in various ways within the framework, including being combined into a single or multiple applications.

In one implementation, an infrastructure of the reservoir production system 300, involves a framework providing distributed processing of the raw reservoir data and storage in the non-relational database 314. Additionally, the infrastructure may include a framework for increasing speed of accessing data from the non-relational database 314. The framework may be a cluster-computing framework that provides an interface for programming clusters with implicit data parallelism and fault tolerance, as well as an in-memory database for quick and efficient data access.

The file system 302 is a distributed, scalable storage layer that is configured to store a large volume of the raw reservoir data, which may be structured data, unstructured data, and/or heterogeneous data. In one implementation, the file system 302 replicates and distributes blocks of data through cluster nodes, along with numerous other features and advantages. As such, the file system 302 generally manages the processing, storage, analysis, and retrieval of large volumes of data in the non-relational database 314.

The file system 302 parses and loads the raw reservoir data into the reservoir production system 300. The connectivity system 304 and/or the aggregation system 306 may extract and import the raw reservoir data into the file system 302 for processing. In one implementation, the connectivity system 304 is configured to import data, such as the raw reservoir data, from disparate sources, including one or more relational databases, into the reservoir production system 300. The connectivity system 304 may be configured to permit a user to assign relevancy values and/or priorities to the data, as well as permit the user to specify a target relevant location for storage. In one implementation, the aggregation system 306 is a framework for populating the reservoir production system 300 with the raw reservoir data from various data sources. For example, the aggregation system 306 may collect and integrate data from distributed data sources, such as log files, web servers, application servers, tools, systems, and user devices.

In one implementation, the transformation system 308 transforms and aggregates data for storage in the non-relational database 314 and subsequent machine learning. Stated differently, the transformation system 314 transforms raw data into tables or other aggregation for storage and analysis in the reservoir production system 300. The transformation system 308 may utilize a high-level data flow language or script for ingesting and transforming data. In some implementations, the transformations involve extracting text from formatted documents and/or creating and parsing data feeds.

In transforming the data, the query system 310 may leverage a clustering framework. For example, a resilient distributed dataset (RDD), which is a read-only multiset of data items distributed over a cluster of machines, maintained in a fault-tolerant manner, may provide a working set for distributed programs involving a restricted form of distributed shared memory. A primary application programming interface (API) may be deployed as an abstraction on top of the RDD of the query system 310 for communication among the data, scripts, user input, and script results. The query system 310 facilitates implementation of iterative algorithms, which visit datasets multiple times in a loop, and interactive data analysis involving repeated database querying of data. Such applications of the query system 310 experience a latency reduction of several orders of magnitude compared to other frameworks. The iterative algorithms of the query system 310 are among the class of training algorithms for machine learning systems.

To facilitate the interpretation of the complex heterogeneous data included in the raw reservoir data, the transformation system 308, which may include the query system 310, transforms the raw reservoir data into transformed data having a more representative and meaningful form, optimized for machine learning. Based on an analysis of the data elements and user input associated with the transformed data, as described herein, the reservoir production system 300 outputs the interpreted NMR log 204. In one implementation, the query system 310 processes data in the reservoir production system 300 and outputs the interpreted NMR log 204 using tools generating standard reporting format. For example, the query system 310 may utilize a data warehousing infrastructure providing tools to enable ad hoc querying and data aggregation of large data sets. The query system 310 permits users to write a query in structured query language (SQL), NOSQL, or other query language, which may be converted as necessary for obtaining relevant data. In another implementation, the query system 310 outputs data in a format enabling further management, analysis, and/or merging with other data sources.

In one implementation, the data mining system 312 outputs the interpreted NMR log 204 utilizing machine learning techniques. Machine learning generally refers to a machine learning through observing data that represents incomplete information about statistical happenings and generalizing such data to rules and/or algorithms that make predictions for future data, trends, and the like. Machine learning typically includes "classification" where machines learn to automatically recognize complex patterns and make intelligent predictions for a class. The data mining system 312 may use a machine learning library that uses algorithms to perform clustering, regression testing, and statistic modeling. In one implementation, the data mining system 312 and/or the query system 310 outputs the interpreted NMR log 204 using ad-hoc reporting and/or machine learning techniques. More particularly, the data mining system 312 and/or the query system 310 employs a machine learning technique to further extract the most useful information and generate the interpreted NMR log 204. One family of machine learning that may be utilized by the reservoir production system 300 includes ensemble learning, which uses multiple learning algorithms to obtain better predictive performance than could be obtained from any of the single constituent learning algorithms alone. For example, the ensemble learning may utilize blending, which is a form of stacking ensemble learning. The reservoir production system 300 may similarly employ such techniques in generating the production characterization 206 using the interpreted NMR log 204.

Figure 4:
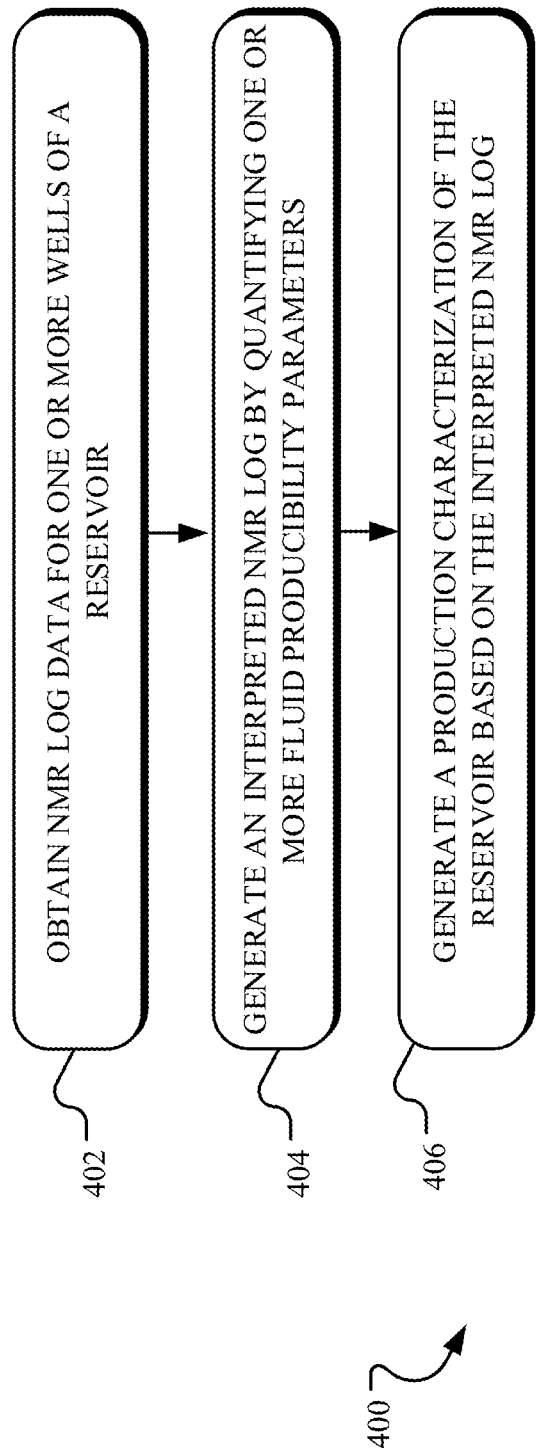
FIG. 4 illustrates example operations for developing resources from a reservoir.

FIG. 4 illustrates example operations 400 for developing resources from a reservoir. In one implementation, an operation 402 obtains NMR log data for one or more wells of the reservoir. The NMR data may be captured using one or more logging tools.

An operation 404 generates an interpreted NMR log, for example, by quantifying one or more fluid producibility parameters. The one or more fluid producibility parameters may be quantified by processing the NMR log data using automated unsupervised machine learning. The one or more fluid producibility parameters may include, without limitation, fluid porosity and saturation, producible oil volume, matrix pore size, formation wettability, and/or the like. The NMR log data may be 2D NMR log data, and the interpreted NMR log may be a 2D log. In some examples, the interpreted NMR log includes one or more signatures of formation fluids. The one or more signatures of formation fluids may include, without limitation, gas, immovable hydrocarbons, producible oil, immovable water, and/or free water. The interpreted NMR log may include fluid and matrix properties. For example, the fluid and matrix properties may include fluid viscosity, pore geometry, fluid-pore interaction, and/or the like. In one implementation, the interpreted NMR log distinguishes fluid typing by separating spin-lattice relaxation time and spin-spin relaxation time signatures of pore-fluids.

An operation 406 generates a production characterization of the reservoir based on the interpreted NMR log. The production characterization may include a characterization of saturation and producibility of hydrocarbons and water. In some examples, the production characterization includes a model of fluid producibility. The model of fluid producibility may include fluid porosity and saturation of oil, water, bound, and producible. In one implementation, the production characterization includes fluid mobility pore sizes and formation wettability determined based on spin-lattice relaxation time and spin-spin relaxation time signatures.

The reservoir may be developed based on the production characterization. Developing the reservoir may include extracting the resources from the reservoir based on the production characterization. In one example, the one or more wells includes a lateral well and developing the reservoir includes determining whether to drill and complete the lateral well. In another example, the one or more wells includes a horizontal well and developing the reservoir includes identifying a landing point for the horizontal well.

Figure 5:
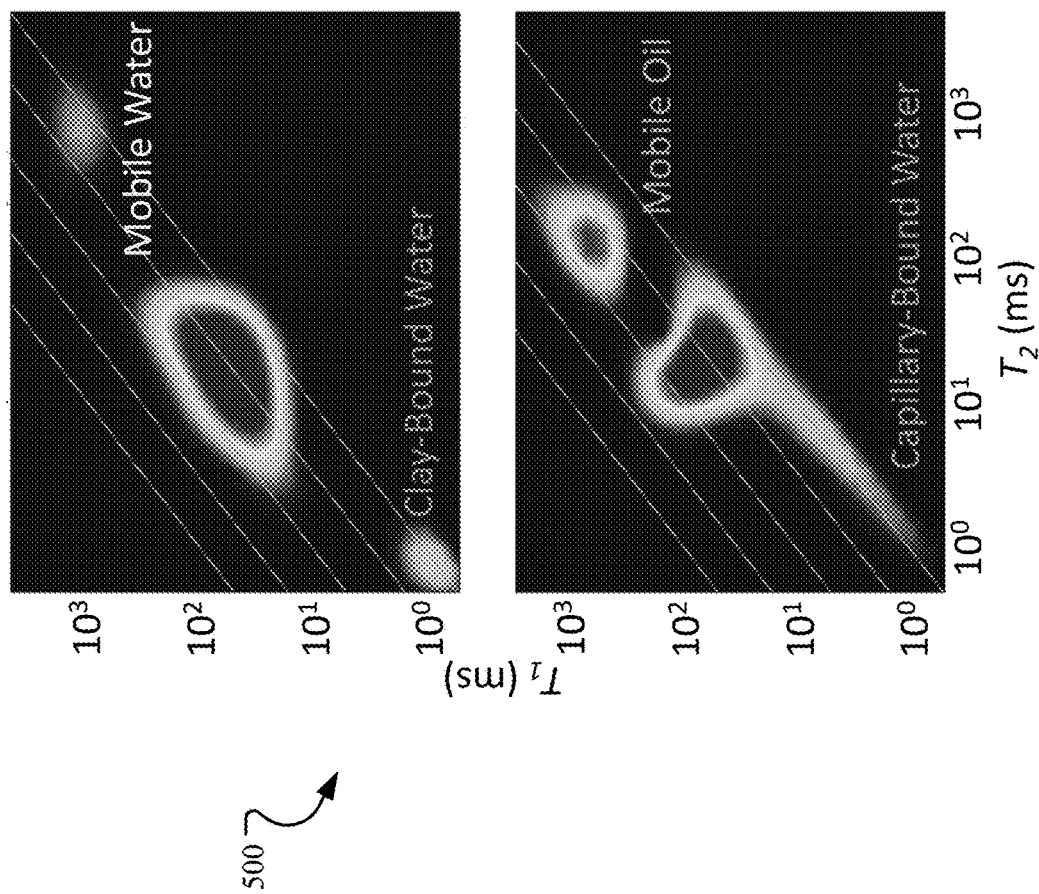
FIG. 5 illustrates charts representing example mixed T1-T2 signatures.

Turning to FIG. 5, charts 500 representing mixed T1-T2 signatures are shown. As can be understood from the charts 500, in-situ fluid types and volumetrics provide tight reservoir characterization. Total water saturations from core and logs are significantly lower than the water cut from production. In this case, an NMR T1-T2 log has been used for fluid typing in tight reservoir characterization and in discriminating mobile oil in connection with the following:

$T1/T2\ (HC) > T1/T2\ (Water)$; and $T2\ (\text{mobile fluid}) > T2\ (\text{immobile fluid})$.

However, NMR signatures are not always well-separated, making fluid typing more challenging. Accordingly, the presently disclosed technology provides optimized separation of NMR signatures as detailed herein.

Figure 6:
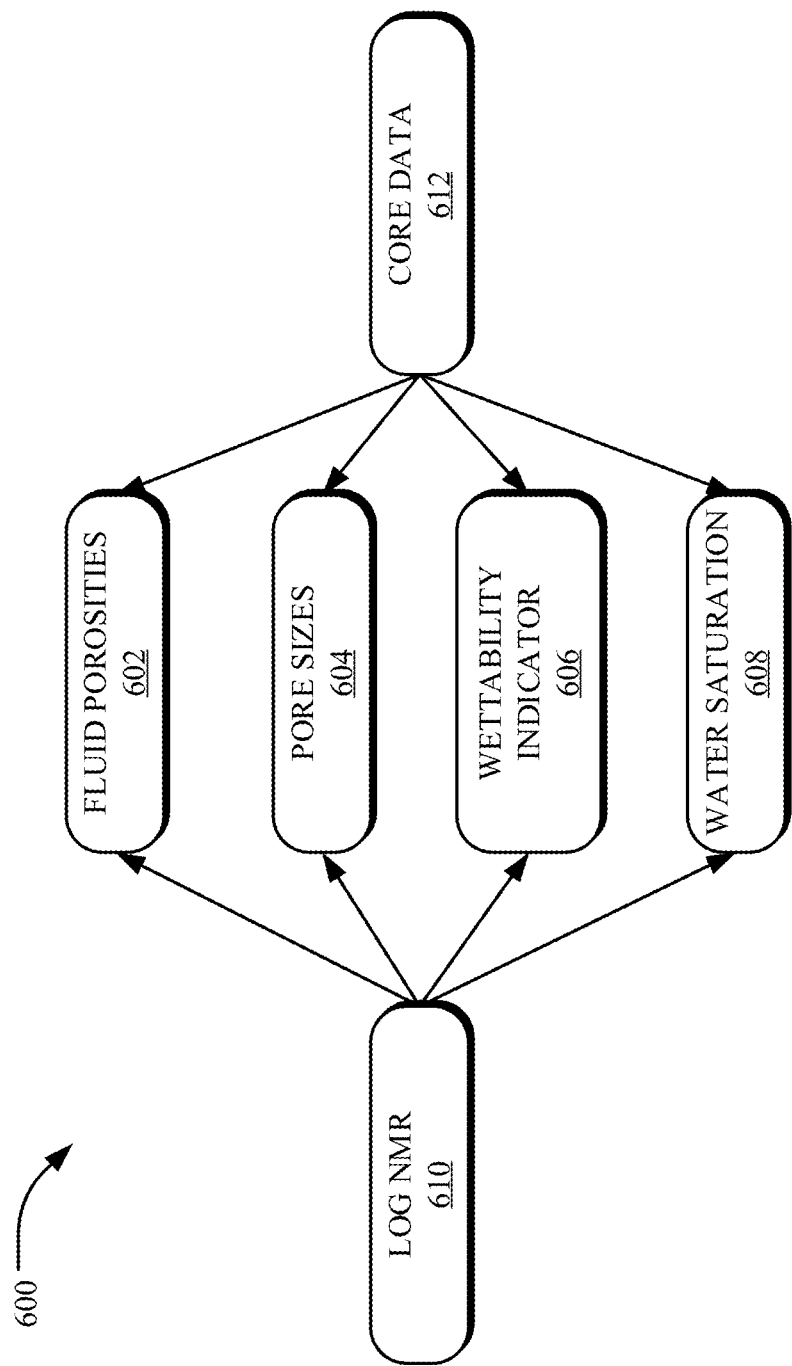
FIG. 6 shows a block diagram of an example optimized workflow for resource development.

Referring to FIG. 6, a diagram 600 illustrating such an optimized workflow is shown. In one implementation, integrated results, including fluid porosities 602, pore sizes 604, wettability indicator 606, and water saturation 608 are obtained from log NMR 610 and core data 612. For example, the fluid porosities 602 may be obtained through unsupervised learning using the log NMR 610 and the core data 612 in the form of Dean-Stark, retort, core NMR, and/or the like. The pore sizes 604 may be obtained using body size from T2 with core calibration from the log NMR 610 and body size from SEM and throat size from MICP from the core data 612. The wettability indicator 606 may be obtained using Archie saturation exponent n from electrical properties and contact angle from sessile drop test from the core data 612 and from the log NMR 610 using the following:

$$SW_{IM} = \frac{\phi_{immobile\ water}}{\phi_{immobile\ water} + \phi_{immobile\ HC}}.$$

The water saturation 608 may be obtained from the log NMR 610 and the core data 612 using the following:

$$SWT = \frac{\phi_{immobile\ water} + \phi_{mobile\ water}}{\phi_{total}};\text{ and}$$

$$SWF = \frac{\phi_{mobile\ water}}{\phi_{movbile\ water} + \phi_{mobile\ oil}}.$$

However, it will be appreciated that these are examples only and not intended to be limiting.

Figure 7:
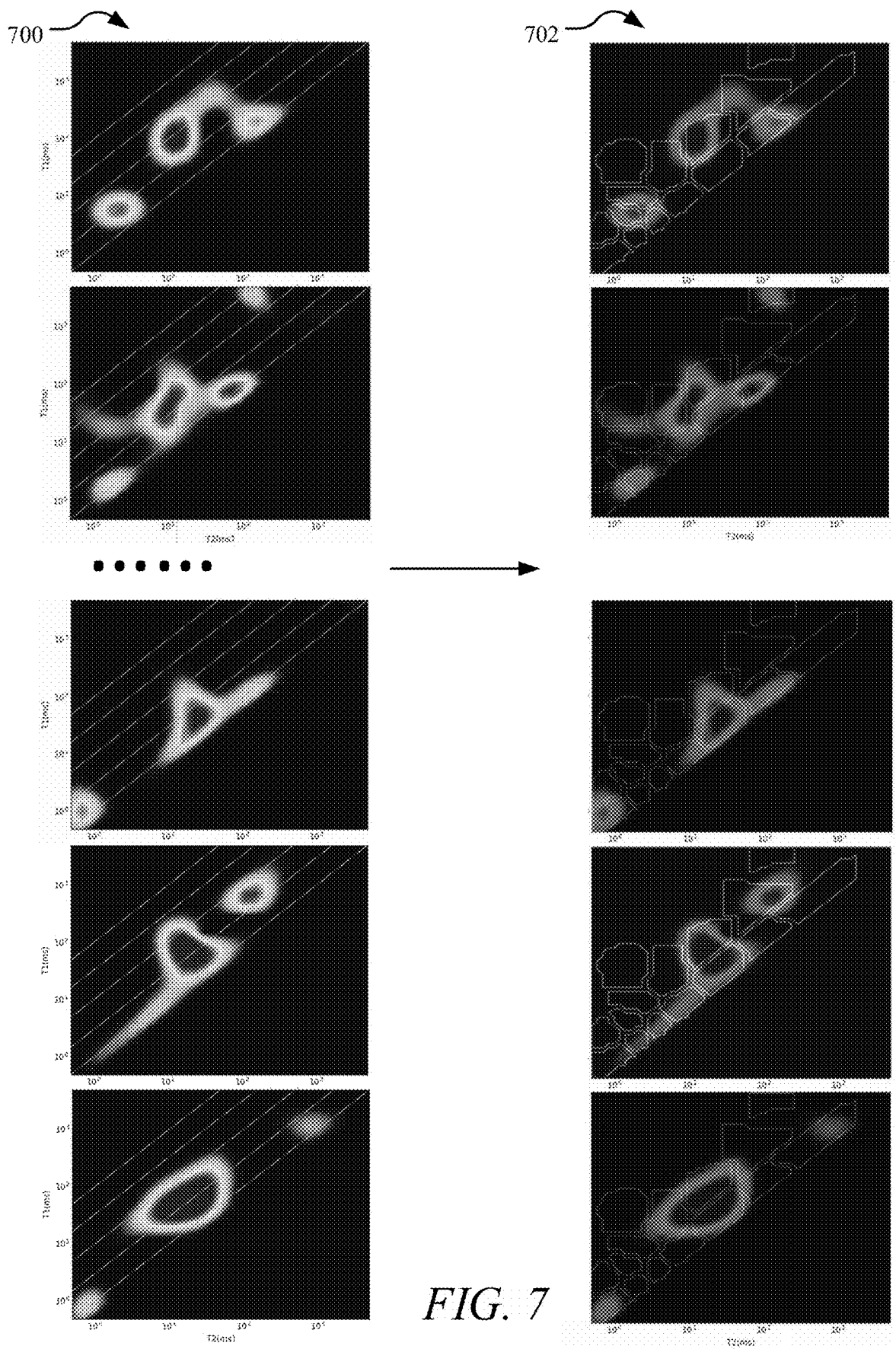
FIGS. 7-8 show portions of an example workflow for determining fluid porosities from an NMR log.
Figure 8:
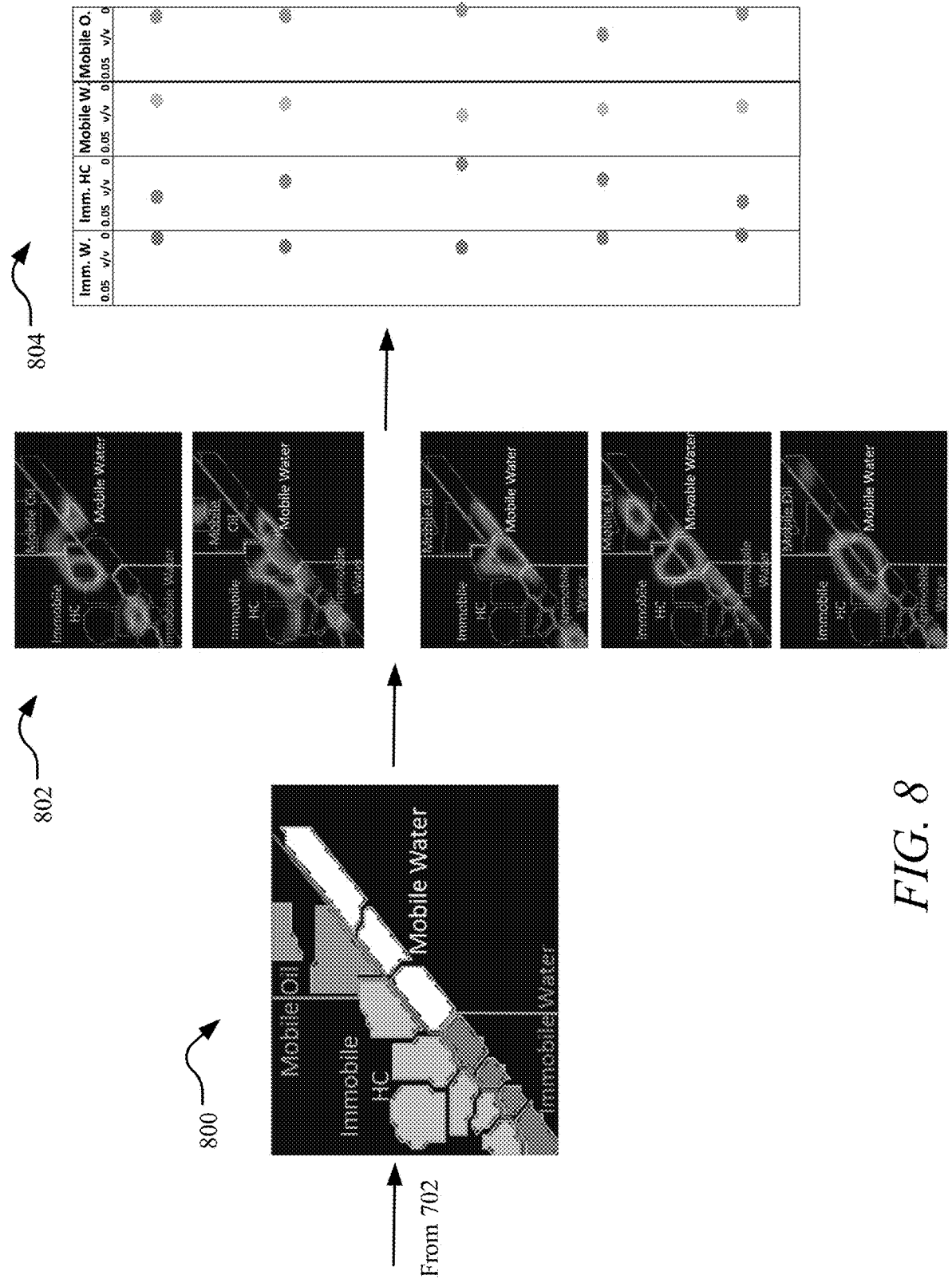

As can be understood from FIGS. 7-8, which illustrate portions of a workflow for determining fluid porosities from an NMR log, in one implementation, a first set of images 700 correspond to an NMR log with a number of data points being greater than a number of fluids. Using the clustering of the first set of images 700, a second set of images 702 with one or more polygons are obtained. As shown in the images 800-802, fluid typing and cutoffs are obtained based on the polygons, and as shown in the chart 804, fluid porosities are obtained using the cutoffs.

Figure 9:
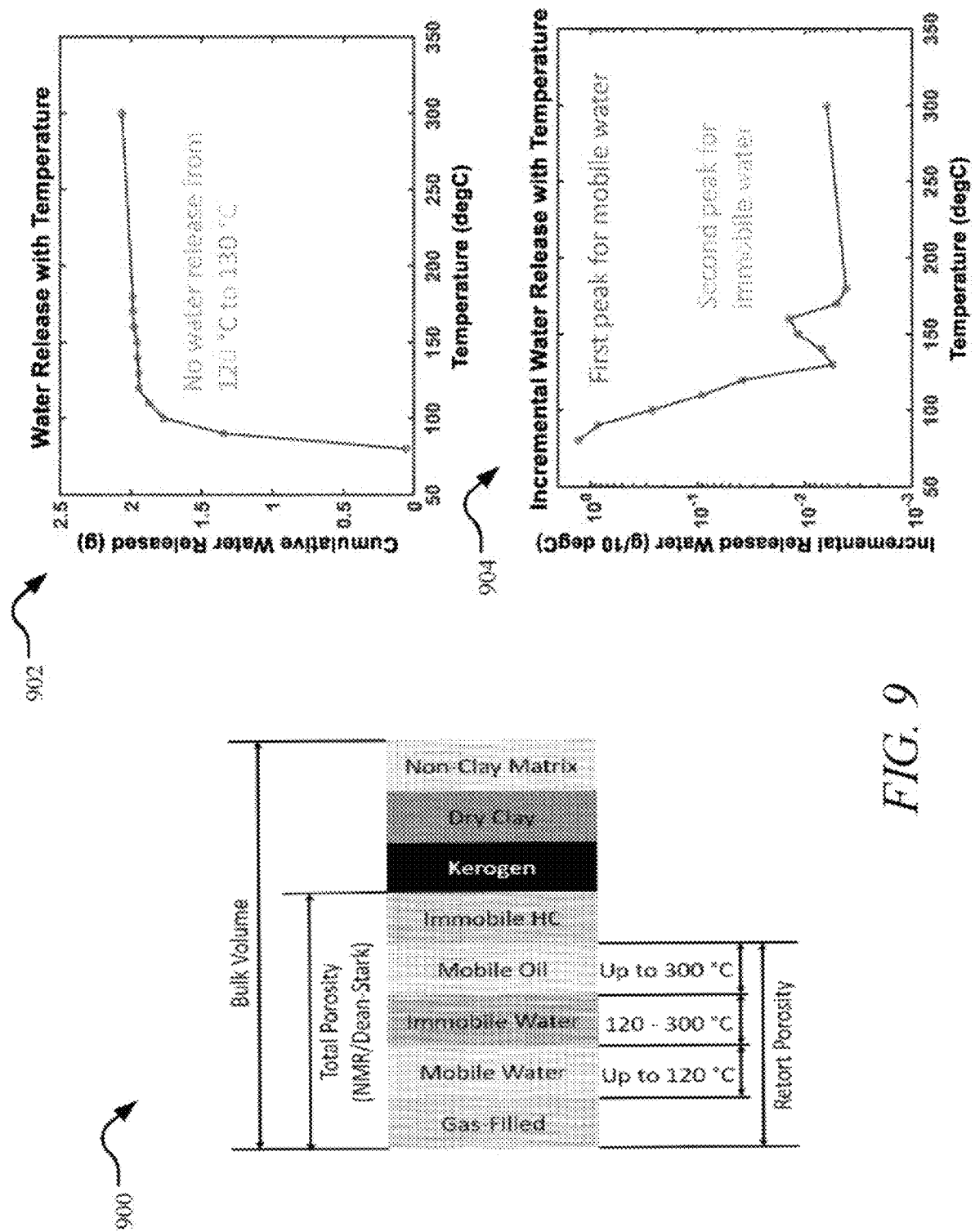
FIG. 9 shows charts illustrating fluid porosities from core data.
Figure 10:
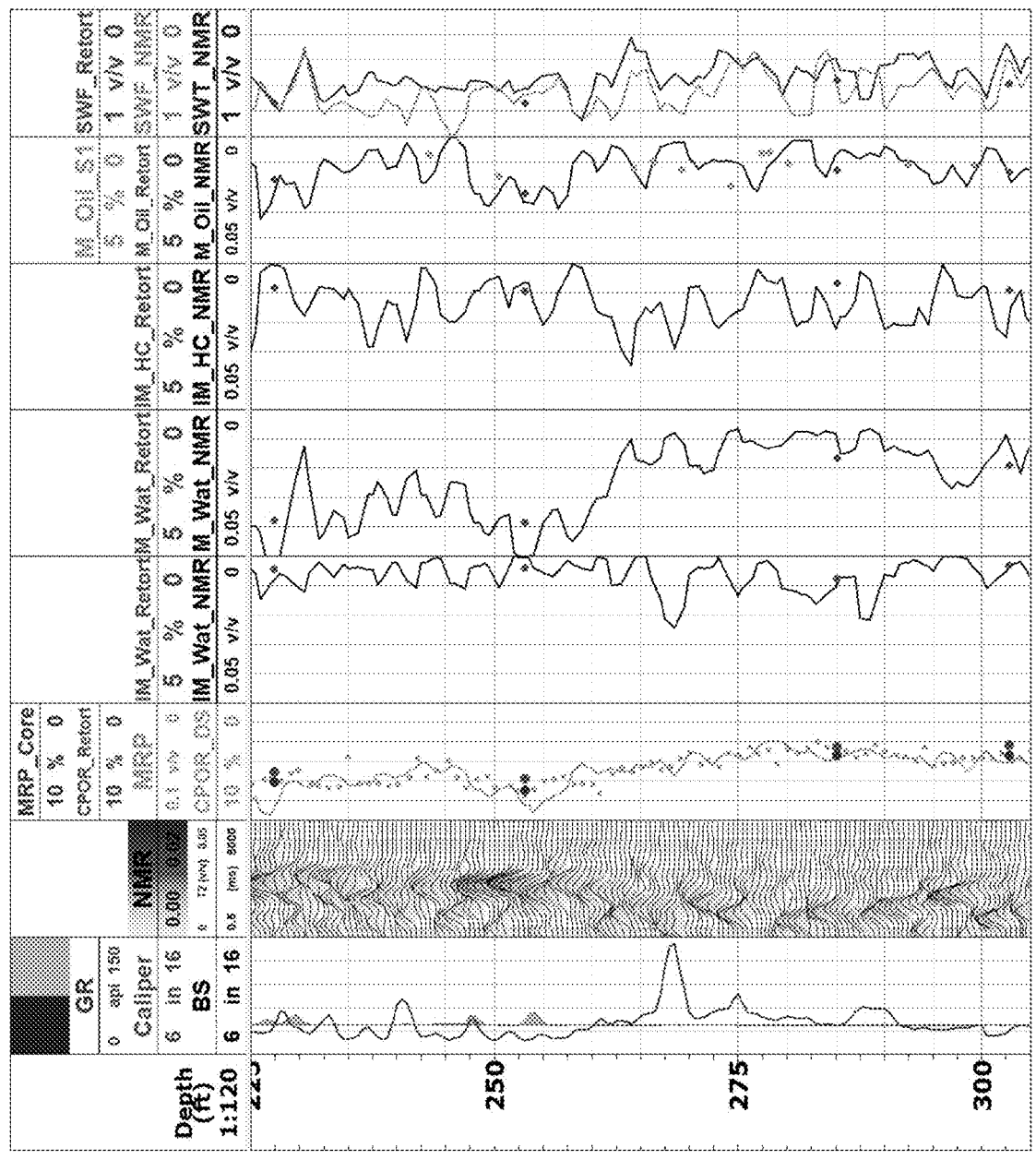
FIG. 10 illustrates a chart with example fluid porosity results.

Turning to FIG. 9, charts 900, 902, and 904 illustrate fluid porosities from core data. As shown, mobile and immobile water may be obtained from retort, mobile oil may be obtained from retort and gas-filled porosity, and immobile hydrocarbons may be obtained from NMR porosity and retort porosity. FIG. 10 shows a chart 1000 illustrating fluid porosity results. Log interpretation and core data show consistency on total and fluid filled porosities with a few exceptions likely being related to borehole rugosity. Mobile oil from Rock-Eval S1 also matches the log result, and the average SWF is 67% versus the average SWT at 51%.

Figure 11:
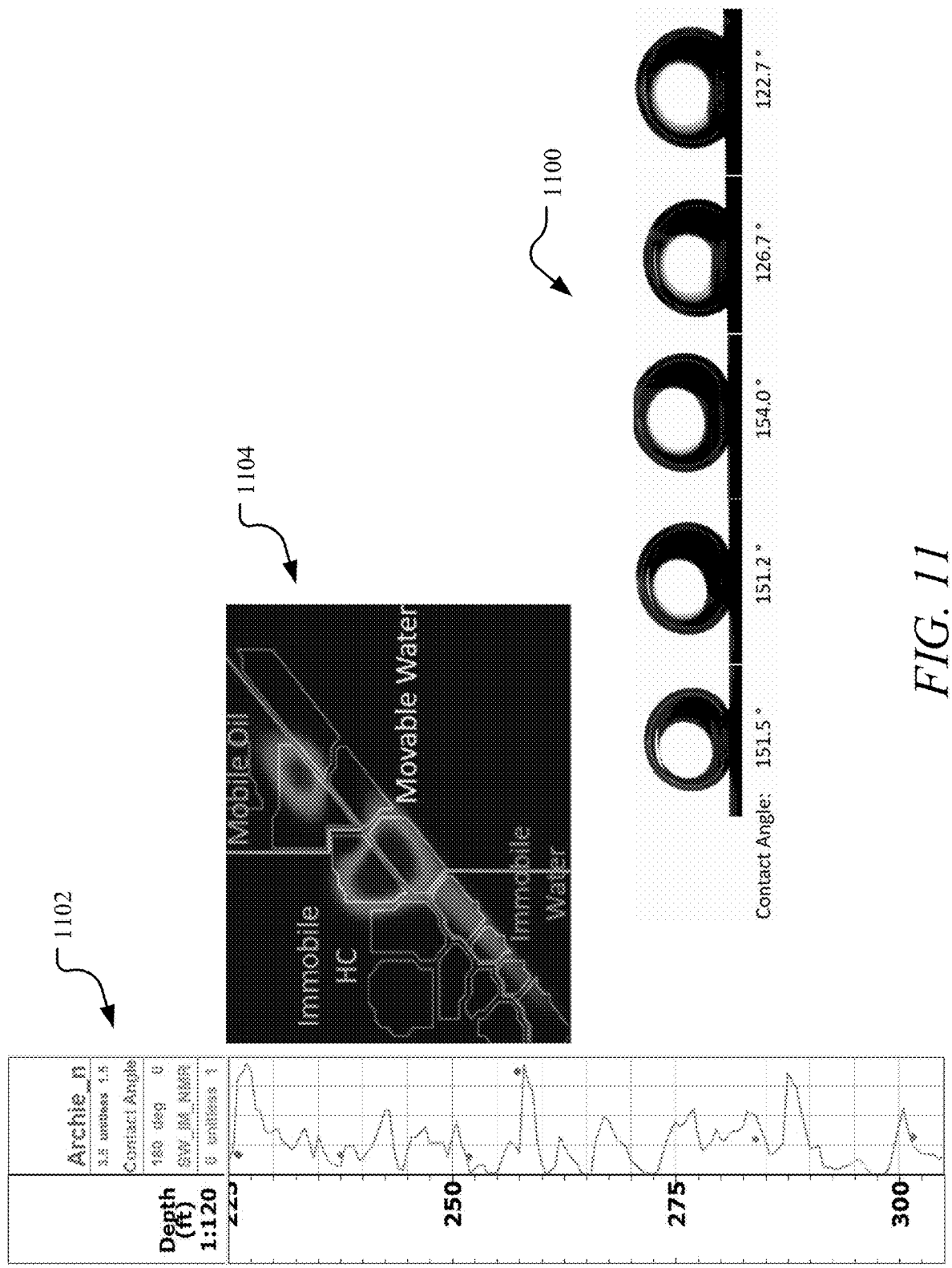
FIG. 11 shows example wettability results.
Figure 12:
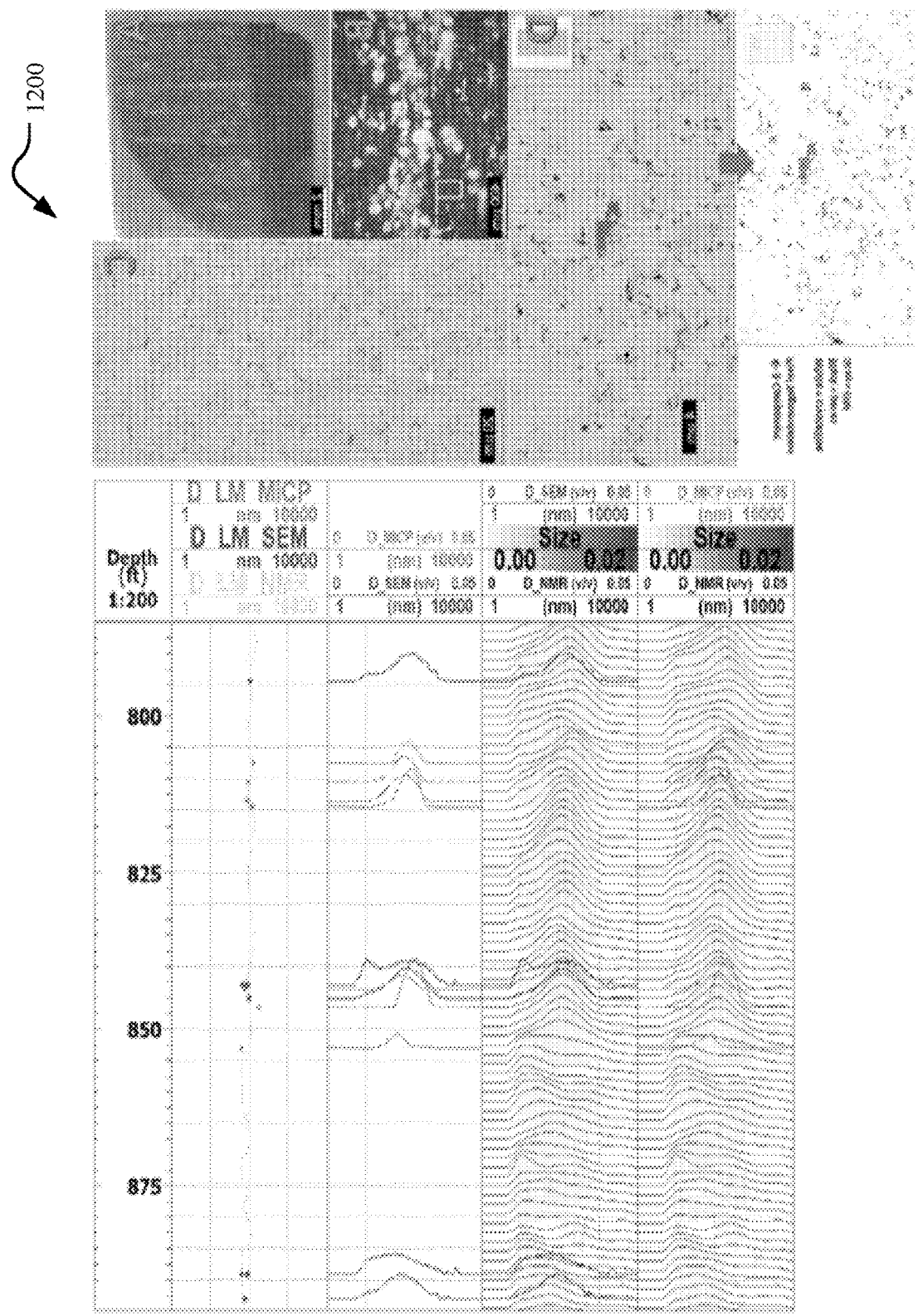
FIG. 12 illustrates example pore size results.

FIG. 11 shows wettability results. A diagram 1100 illustrates a water droplet in decalin on a sample surface from five depths. With reference to the diagram 1100 and a chart 1102 and image 1104, it will be appreciated that in this example, contact angles are greater than ninety degrees, and T1-T2 ratios of both immobile hydrocarbons and mobile oil are higher than three. Further, there is a relatively low SW IM at most of the interval, except at a few depths, with a lower saturation exponent n. The formation shown in the example of FIG. 11 therefore appears more oil-wet. Turning to FIG. 12, example pore sizes results 1200 are similarly illustrated.

As demonstrated by these non-limiting examples shown in FIGS. 5-12, the presently disclosed technology provides a new interpretation workflow applied through integrated unsupervised learning, with NMR and core analysis to quantify producible oil and provide more accurate reservoir property characterization. The fluid porosity and saturation are consistent with those from retort analysis and Rock-Eval pyrolysis. Results from log NMR, core contact angle, and saturation exponent in these examples all show that the example formation is partially oil-wet. The average water saturation in the zone of interest increases from 51% to 67% (SWF vs. SWT) using mobile fluid porosity instead of total porosity. The new water saturation, SWF, is more consistent with water cut from production, which is higher than SWT.

Figure 13:
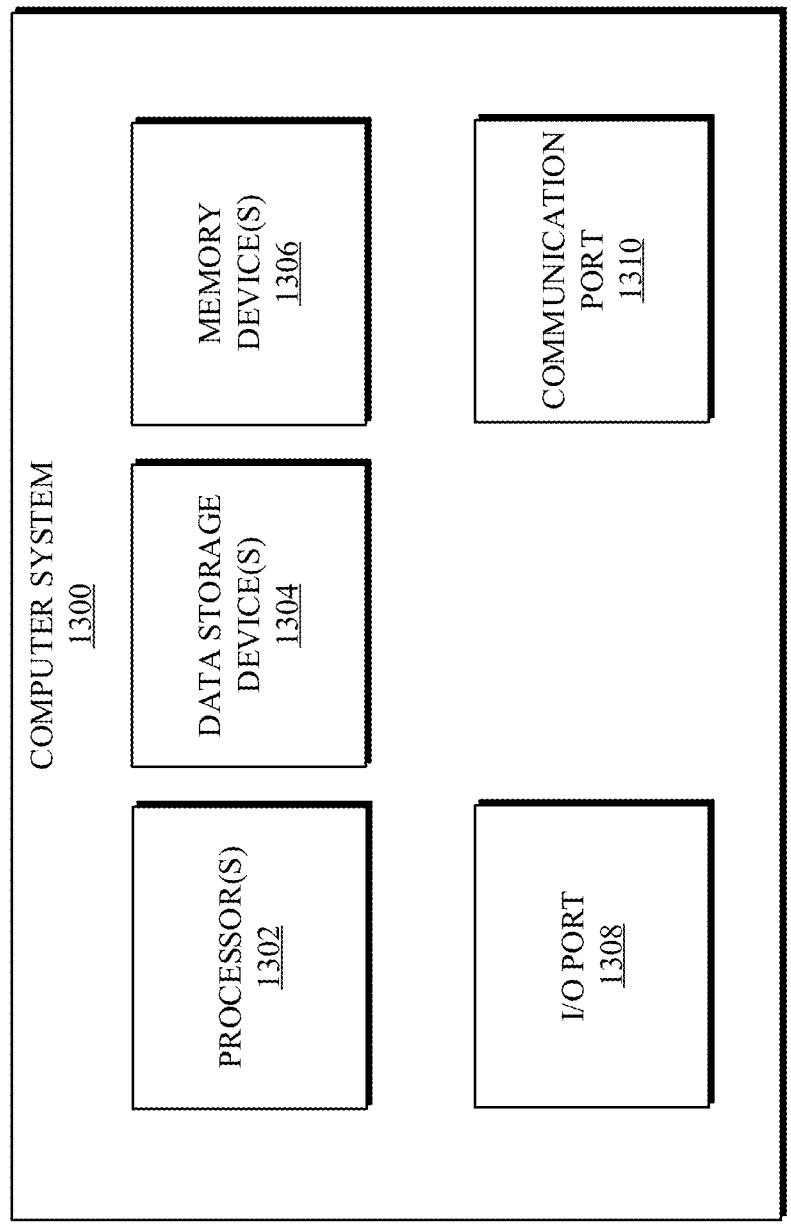
FIG. 13 depicts an example computing system that may implement various systems and methods discussed herein.

Referring to FIG. 13, a detailed description of an example computing system 1300 having one or more computing units that may implement various systems and methods discussed herein is provided. The computing system 1300 may be applicable to the reservoir production system 134, various systems or aspects of the reservoir production system 300, and other computing or network devices or tools. It will be appreciated that specific implementations of these devices may be of differing possible specific computing architectures not all of which are specifically discussed herein but will be understood by those of ordinary skill in the art.

The computer system 1300 may be a computing system is capable of executing a computer program product to execute a computer process. Data and program files may be input to the computer system 1300, which reads the files and executes the programs therein. Some of the elements of the computer system 1300 are shown in FIG. 13, including one or more hardware processors 1302, one or more data storage devices 1304, one or more memory devices 1308, and/or one or more ports 1308-1310. Additionally, other elements that will be recognized by those skilled in the art may be included in the computing system 1300 but are not explicitly depicted in FIG. 13 or discussed further herein. Various elements of the computer system 1300 may communicate with one another by way of one or more communication buses, point-to-point communication paths, or other communication means not explicitly depicted in FIG. 13.

The processor 1302 may include, for example, a central processing unit (CPU), a microprocessor, a microcontroller, a digital signal processor (DSP), and/or one or more internal levels of cache. There may be one or more processors 1302, such that the processor 1302 comprises a single central-processing unit, or a plurality of processing units capable of executing instructions and performing operations in parallel with each other, commonly referred to as a parallel processing environment.

The computer system 1300 may be a conventional computer, a distributed computer, or any other type of computer, such as one or more external computers made available via a cloud computing architecture. The presently described technology is optionally implemented in software stored on the data stored device(s) 1304, stored on the memory device(s) 1306, and/or communicated via one or more of the ports 1308-1310, thereby transforming the computer system 1300 in FIG. 13 to a special purpose machine for implementing the operations described herein. Examples of the computer system 1300 include personal computers, terminals, workstations, mobile phones, tablets, laptops, personal computers, multimedia consoles, gaming consoles, set top boxes, and the like.

The one or more data storage devices 1304 may include any non-volatile data storage device capable of storing data generated or employed within the computing system 1300, such as computer executable instructions for performing a computer process, which may include instructions of both application programs and an operating system (OS) that manages the various components of the computing system 1300. The data storage devices 1304 may include, without limitation, magnetic disk drives, optical disk drives, solid state drives (SSDs), flash drives, and the like. The data storage devices 1304 may include removable data storage media, non-removable data storage media, and/or external storage devices made available via a wired or wireless network architecture with such computer program products, including one or more database management products, web server products, application server products, and/or other additional software components. Examples of removable data storage media include Compact Disc Read-Only Memory (CD-ROM), Digital Versatile Disc Read-Only Memory (DVD-ROM), magneto-optical disks, flash drives, and the like. Examples of non-removable data storage media include internal magnetic hard disks, SSDs, and the like. The one or more memory devices 1306 may include volatile memory (e.g., dynamic random-access memory (DRAM), static random-access memory (SRAM), etc.) and/or non-volatile memory (e.g., read-only memory (ROM), flash memory, etc.).

Computer program products containing mechanisms to effectuate the systems and methods in accordance with the presently described technology may reside in the data storage devices 1304 and/or the memory devices 1306, which may be referred to as machine-readable media. It will be appreciated that machine-readable media may include any tangible non-transitory medium that is capable of storing or encoding instructions to perform any one or more of the operations of the present disclosure for execution by a machine or that is capable of storing or encoding data structures and/or modules utilized by or associated with such instructions. Machine-readable media may include a single medium or multiple media (e.g., a centralized or distributed database, and/or associated caches and servers) that store the one or more executable instructions or data structures.

In some implementations, the computer system 1300 includes one or more ports, such as an input/output (I/O) port 1308 and a communication port 1310, for communicating with other computing, network, or vehicle devices. It will be appreciated that the ports 1308-1310 may be combined or separate and that more or fewer ports may be included in the computer system 1300.

The I/O port 1308 may be connected to an I/O device, or other device, by which information is input to or output from the computing system 1300. Such I/O devices may include, without limitation, one or more input devices, output devices, and/or environment transducer devices.

In one implementation, the input devices convert a human-generated signal, such as, human voice, physical movement, physical touch or pressure, and/or the like, into electrical signals as input data into the computing system 1300 via the I/O port 1308. Similarly, the output devices may convert electrical signals received from computing system 1300 via the I/O port 1308 into signals that may be sensed as output by a human, such as sound, light, and/or touch. The input device may be an alphanumeric input device, including alphanumeric and other keys for communicating information and/or command selections to the processor 1302 via the I/O port 1308. The input device may be another type of user input device including, but not limited to: direction and selection control devices, such as a mouse, a trackball, cursor direction keys, a joystick, and/or a wheel; one or more sensors, such as a camera, a microphone, a positional sensor, an orientation sensor, a gravitational sensor, an inertial sensor, and/or an accelerometer; and/or a touch-sensitive display screen ("touchscreen"). The output devices may include, without limitation, a display, a touchscreen, a speaker, a tactile and/or haptic output device, and/or the like. In some implementations, the input device and the output device may be the same device, for example, in the case of a touchscreen.

The environment transducer devices convert one form of energy or signal into another for input into or output from the computing system 1300 via the I/O port 1308. For example, an electrical signal generated within the computing system 1300 may be converted to another type of signal, and/or vice-versa. In one implementation, the environment transducer devices sense characteristics or aspects of an environment local to or remote from the computing device 1300, such as, light, sound, temperature, pressure, magnetic field, electric field, chemical properties, physical movement, orientation, acceleration, gravity, and/or the like. Further, the environment transducer devices may generate signals to impose some effect on the environment either local to or remote from the example computing device 1300, such as, physical movement of some object (e.g., a mechanical actuator), heating or cooling of a substance, adding a chemical substance, and/or the like.

In one implementation, a communication port 1310 is connected to a network by way of which the computer system 1300 may receive network data useful in executing the methods and systems set out herein as well as transmitting information and network configuration changes determined thereby. Stated differently, the communication port 1310 connects the computer system 1300 to one or more communication interface devices configured to transmit and/or receive information between the computing system 1300 and other devices by way of one or more wired or wireless communication networks or connections. Examples of such networks or connections include, without limitation, Universal Serial Bus (USB), Ethernet, Wi-Fi, Bluetooth®, Near Field Communication (NFC), Long-Term Evolution (LTE), and so on. One or more such communication interface devices may be utilized via the communication port 1310 to communicate one or more other machines, either directly over a point-to-point communication path, over a wide area network (WAN) (e.g., the Internet), over a local area network (LAN), over a cellular (e.g., third generation (3G) or fourth generation (4G)) network, or over another communication means. Further, the communication port 1310 may communicate with an antenna or other link for electromagnetic signal transmission and/or reception.

In an example implementation, the NMR log data, interpreted NMR logs, production characterizations, software and other modules and services may be embodied by instructions stored on the data storage devices 1304 and/or the memory devices 1306 and executed by the processor 1302.

The system set forth in FIG. 13 is but one possible example of a computer system that may employ or be configured in accordance with aspects of the present disclosure. It will be appreciated that other non-transitory tangible computer-readable storage media storing computer-executable instructions for implementing the presently disclosed technology on a computing system may be utilized.

In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order and are not necessarily meant to be limited to the specific order or hierarchy presented.

The described disclosure may be provided as a computer program product, or software, that may include a non-transitory machine-readable medium having stored thereon instructions, which may be used to program a computer system (or other electronic devices) to perform a process according to the present disclosure. A machine-readable medium includes any mechanism for storing information in a form (e.g., software, processing application) readable by a machine (e.g., a computer). The machine-readable medium may include, but is not limited to, magnetic storage medium, optical storage medium; magneto-optical storage medium, read only memory (ROM); random access memory (RAM); erasable programmable memory (e.g., EPROM and EEPROM); flash memory; or other types of medium suitable for storing electronic instructions.

While the present disclosure has been described with reference to various implementations, it will be understood that these implementations are illustrative and that the scope of the present disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A method for developing resources from a reservoir, the method comprising:
 obtaining nuclear magnetic resonance (NMR) log data for one or more wells of the reservoir, the NMR log data captured using one or more logging tools;
 generating an interpreted NMR log by quantifying one or more fluid producibility parameters, the one or more fluid producibility parameters quantified by processing the NMR log data using automated unsupervised machine learning to produce one or more fluid signatures; and
 generating a production characterization of the reservoir based on the one or more fluid signatures of the interpreted NMR log, the reservoir being developed based on the production characterization.

2. The method of claim 1, wherein developing the reservoir includes extracting the resources from the reservoir based on the production characterization.

3. The method of claim 1, wherein the one or more wells includes a lateral well and wherein developing the reservoir includes determining whether to drill and complete the lateral well.

4. The method of claim 1, wherein the one or more wells includes a horizontal well and wherein developing the reservoir includes identifying a landing point for the horizontal well.

5. The method of claim 1, wherein the one or more fluid producibility parameters includes fluid porosity and saturation.

6. The method of claim 1, wherein the one or more fluid producibility parameters includes producible oil volume.

7. The method of claim 1, wherein the one or more fluid producibility parameters includes matrix pore size.

8. The method of claim 1, wherein the one or more fluid producibility parameters includes formation wettability.

9. The method of claim 1, wherein the production characterization includes a characterization of saturation and producibility of hydrocarbons and water.

10. The method of claim 1, wherein the NMR log data is two-dimensional NMR log data and the interpreted NMR log is a two-dimensional NMR log.

11. The method of claim 1, wherein the production characterization includes a model of fluid producibility, the model of fluid producibility including fluid porosity and saturation of oil, water, bound, and producible.

12. The method of claim 1, wherein the interpreted NMR log includes one or more signatures of formation fluids, the one or more signatures of formation fluids including gas, immovable hydrocarbons, producible oil, immovable water, and free water.

13. The method of claim 1, wherein the interpreted NMR log includes fluid and matrix properties, the fluid and matrix properties including fluid viscosity, pore geometry, and fluid-pore interaction.

14. The method of claim 1, wherein the interpreted NMR log distinguishes fluid typing by separating spin-lattice relaxation time and spin-spin relaxation time signatures of pore-fluids.

15. The method of claim 1, wherein the production characterization includes fluid mobility pore sizes and formation wettability determined based on spin-lattice relaxation time and spin-spin relaxation time signatures.

16. One or more tangible non-transitory computer-readable storage media storing computer-executable instructions for performing a computer process on a computing system, the computer process comprising:
  obtaining nuclear magnetic resonance (NMR) log data for one or more wells of the reservoir, the NMR log data captured using one or more logging tools;
  generating an interpreted NMR log by quantifying one or more fluid producibility parameters, the one or more fluid producibility parameters quantified by processing the NMR log data using automated unsupervised machine learning to produce one or more fluid signatures; and
  generating a production characterization of the reservoir based on the one or more fluid signatures of the interpreted NMR log, the reservoir being developed based on the production characterization.

17. The one or more tangible non-transitory computer-readable storage media of claim 16, wherein the production characterization includes a characterization of saturation and producibility of hydrocarbons and water.

18. The one or more tangible non-transitory computer-readable storage media of claim 16, wherein the production characterization includes a model of fluid producibility, the model of fluid producibility including fluid porosity and saturation of oil, water, bound, and producible.

19. The one or more tangible non-transitory computer-readable storage media of claim 16, wherein the production characterization includes fluid mobility pore sizes and formation wettability determined based on spin-lattice relaxation time and spin-spin relaxation time signatures.

20. A system for developing resources from a reservoir, the system comprising:
  a non-relational database storing nuclear magnetic resonance (NMR) log data for one or more wells of the reservoir, the NMR log data captured using one or more logging tools; and
  a reservoir production system extracting the NMR log data from the non-relational database and generating an interpreted NMR log by quantifying one or more fluid producibility parameters, the one or more fluid producibility parameters quantified by processing the NMR log data using automated unsupervised machine learning to produce one or more fluid signatures, a production characterization of the reservoir generated based on the one or more fluid signatures of the interpreted NMR log.

\* \* \* \* \*